(12) United States Patent
Loibl

(10) Patent No.: US 9,699,929 B2
(45) Date of Patent: Jul. 4, 2017

(54) ARRANGEMENT OF AN ELECTRIC CONTROL DEVICE ON A CIRCUIT BOARD

(71) Applicant: ZF Friedrichshafen AG, Friedrichshafen (DE)

(72) Inventor: Josef Loibl, Bad Abbach (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 57 days.

(21) Appl. No.: 14/425,557

(22) PCT Filed: Aug. 5, 2013

(86) PCT No.: PCT/EP2013/066352
§ 371 (c)(1),
(2) Date: Mar. 3, 2015

(87) PCT Pub. No.: WO2014/037173
PCT Pub. Date: Mar. 13, 2014

(65) Prior Publication Data
US 2015/0208541 A1 Jul. 23, 2015

(30) Foreign Application Priority Data

Sep. 4, 2012 (DE) .................... 10 2012 215 673

(51) Int. Cl.
*H05K 5/00* (2006.01)
*H05K 7/00* (2006.01)
(Continued)

(52) U.S. Cl.
CPC ....... *H05K 7/1427* (2013.01); *F16H 61/0006* (2013.01); *H05K 1/181* (2013.01);
(Continued)

(58) Field of Classification Search
None
See application file for complete search history.

(56) References Cited

U.S. PATENT DOCUMENTS 6,028,770 A * 2/2000 Kerner ................ B60R 16/0239
165/80.2
6,817,247 B1 * 11/2004 Hilberer ................ B60T 8/3675
73/714

(Continued)

FOREIGN PATENT DOCUMENTS

DE 197 15 592 A1 10/1998
DE 198 21 897 A1 11/1998
(Continued)

OTHER PUBLICATIONS

International Preliminary Report on Patentability issued Jan. 7, 2015 in International Application No. PCT/EP2013/066352 (German Language) (14 pages).
(Continued)

*Primary Examiner* — Courtney Smith
*Assistant Examiner* — Rashen E Morrison
(74) *Attorney, Agent, or Firm* — Brinks Gilson & Lione

(57) ABSTRACT

The present disclosure relates to a construction kit for a transmission element and an electric control device connected to the transmission element, wherein the electric control device comprises a circuit board equipped with electronic components, and a housing that at least partially encompasses the circuit board, wherein the transmission element has a recess, in which at least a portion of the housing for the electric control device engages.

19 Claims, 3 Drawing Sheets

(51) Int. Cl.
*H05K 7/14* (2006.01)
*F16H 61/00* (2006.01)
*H05K 7/20* (2006.01)
*H05K 1/18* (2006.01)
*H05K 5/02* (2006.01)

(52) U.S. Cl.
CPC ......... *H05K 5/0073* (2013.01); *H05K 5/0082* (2013.01); *H05K 5/0213* (2013.01); *H05K 7/20854* (2013.01)

(56) References Cited

U.S. PATENT DOCUMENTS

| | | | | |
|---|---|---|---|---|
| 7,007,666 | B2* | 3/2006 | Kamimura | F02D 9/1065 123/337 |
| 7,375,966 | B2* | 5/2008 | Murakami | B60R 16/0239 257/706 |
| 8,184,438 | B2* | 5/2012 | Kaneko | H05K 7/026 165/80.2 |
| 2004/0035245 | A1* | 2/2004 | Albert | F16H 61/0006 74/606 A |
| 2005/0094356 | A1* | 5/2005 | Onizuka | B60R 16/0238 361/611 |
| 2006/0075848 | A1* | 4/2006 | Suzuki | B60R 16/0207 74/606 R |
| 2008/0278918 | A1* | 11/2008 | Tominaga | B62D 5/0406 361/719 |
| 2011/0228478 | A1* | 9/2011 | Takata | F16H 61/0006 361/699 |
| 2013/0215582 | A1* | 8/2013 | Dittrich | H05K 5/061 361/752 |
| 2015/0029669 | A1* | 1/2015 | Liskow | H05K 7/209 361/709 |
| 2015/0077959 | A1* | 3/2015 | Loibl | H01R 12/58 361/760 |

FOREIGN PATENT DOCUMENTS

| | | |
|---|---|---|
| DE | 201 15 922 | 1/2002 |
| DE | 101 43 929 A1 | 3/2002 |
| DE | WO 2008/006637 A1 | 1/2008 |
| DE | 10 2006 054 402 A1 | 5/2008 |
| DE | EP 2273859 A2 | 1/2011 |

OTHER PUBLICATIONS

International Search Report issued Dec. 3, 2013 in International Application No. PCT/EP2013/066352 (2 pages).
International Search Report and Written Opinion from corresponding International Patent Application PCT/EP2013/066352, dated Dec. 3, 2013 (German Language) (10 pages).
Office Action from corresponding DE 10 2012 215 673.9, dated May 14, 2013 (6 pages)(including English translation of p. 5).

* cited by examiner

ARRANGEMENT OF AN ELECTRIC CONTROL DEVICE ON A CIRCUIT BOARD

This application is a filing under 35 U.S.C. §371 of International Patent Application PCT/EP2013/066352, filed Aug. 5, 2013, and claims the priority of DE 10 2012 215 673.9, filed Sep. 4, 2012. These applications are incorporated by reference herein in their entirety.

The present disclosure relates to a construction kit system for a transmission element and an electric control device connected to the transmission element according to the features in the preamble of the asserted claim 1.

Transmission controls for vehicle transmissions comprise a central electronic control unit, to which further control assemblies, such as sensors, valves, a connector for a connection to another vehicle system, and suchlike, can be connected. Frequently, the completed, housed electronic control unit is attached to a transmission element, such as a switch plate.

DE 10 2007 061 116 A1 relates to a control device housing, in particular for a transmission control module of a transmission for a motor vehicle. The control device housing comprises a first housing part and a second, cover-shaped, housing part.

The unpublished application, DE 10 2011 007 300.0 describes a control device, which covers a recess provided in a transmission element with a printed circuit board. Electronic components disposed on the printed circuit board, for example, protrude in this recess. In order to dissipate the heat generated by the electronic components, heat sinks are present, which fill the intermediate space between the bottom of the recess in the transmission element and the electronic components disposed on the printed circuit board. These heat sink elements normally concern a thermal compound, which forms a non-releasable connection between the transmission element and the control device.

Due to the demand for a shorter installation time, as well as a simpler replacement of a defective control device in the case of repairs, the object of the present disclosure is to provide an assembly with which the disadvantages of the prior art are eliminated.

This object is achieved with the construction kit system according to the features of the asserted claims. Advantageous embodiments of the present disclosure are the subject matter of the dependent claims.

The present disclosure creates an assembly in the form of a construction kit system for a transmission element and an electric control device connected to the transmission element, wherein the electric control device comprises a printed circuit board equipped with electronic components, and a housing, which at least partially encloses the printed circuit board, characterized in that the transmission element has a recess in which at least a portion of the housing for the electric control device engages.

The electric control device is, for practical purposes, an electric control device for a transmission in a vehicle. The vehicle can be a motor vehicle, such as a passenger car or a truck, having a manual or automatic transmission. The control device can assume thereby a central controlling function of the transmission control. The housing of the control device can implement thereby a heat dissipation function and/or a mechanical protection for the printed circuit board. The printed circuit board can be a circuitry plate, as is known in the field. The printed circuit board can have a multi-layer design. The electronic components of the control device are disposed on the printed circuit board. For this, the electronic components are disposed in a component region of the printed circuit board. The electronic components can be switching elements, logic elements and other suitable electric or electronic components. Electric connections for the electrical components are connected, in a conductive manner, to conductive paths formed on or within the printed circuit board. At least some of the conductive paths of the printed circuit board are connected to the electrical contacts, which are disposed in a contact region of the printed circuit board. The conductive paths can be connecting lines made of an electrical conductive material, such as copper. The conductive paths can be printed on the printed circuit board, or etched into the printed circuit board. The conductive paths can be formed in a coating or a layer of a multi-layer printed circuit board. In this manner, contact can be established to the electric components via the contacts disposed outside the housing. The electrical contacts can be suitable connecting elements for connecting additional transmission control elements to the control device. For this, the electrical contacts can be designed, for example, as connecting surfaces, plug-in contacts, connecting sockets, or suchlike. Connections with the electrical contacts can be formed in the manner of a non-releasable, material-bonded connection, or as a releasable, force-locking or form-locking connection. The other transmission control elements can be sensors and valves thereby, which are normally used in a transmission control. When the other transmission control elements are connected, in addition to the electrical conducting connection, a mechanical connection between the control device and the other transmission elements or connecting cables to the other transmission control elements can be established. The housing for the control device is formed thereby such that access to the electrical contacts in the contact region of the printed circuit board enables a connecting of the other transmission control elements. The transmission element can be, for example, a hydraulic switch plate, or a transmission housing. For this, an attachment can occur, for example, on a surface of the hydraulic switch plate disposed inside the transmission housing, or on an inner surface of the transmission housing.

Thus, a compact construction having a lower structural height is obtained by means of the present disclosure. Moreover, a lower weight is obtained.

The housing encompasses the printed circuit board, and the electronic components disposed thereon, in the region of the top and bottom surfaces. In order for the conductive paths to make contact with the exterior contact region, holes are provided in the housing. The contact region for the printed circuit board is located outside the housing.

In one embodiment of the present disclosure, the transmission element has further recesses for accommodating regions of the printed circuit board extending outside of the housing. These regions can be the contact region of the printed circuit board, or other recesses, serving for the attachment of the control device to the transmission element. In this manner, the structure can be further reduced in size.

In another embodiment of the present disclosure, attachment means are present, for establishing a releasable connection between the electric control device and the transmission element.

The present disclosure shall be explained in greater detail based on the attached drawings. Shown are:

In the following description of preferred embodiment examples of the present disclosure, the same, or similar, reference symbols are used for the elements and similar functioning elements depicted in the various figures, wherein there shall be no repeated description of these elements.

Figure 1:
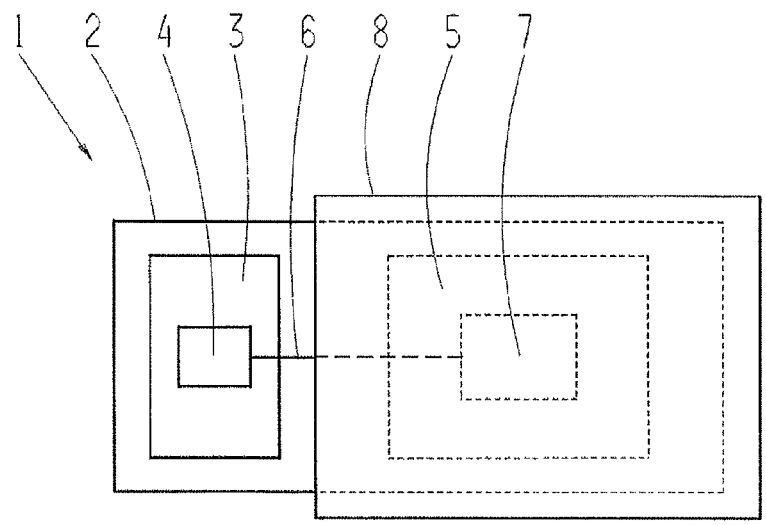
FIG. 1 is a schematic depiction of a control device according to the prior art.

FIG. 1 shows a schematic depiction of a prior art control device 1. A control device 1 is shown, having a printed circuit board 2 with a contact region 3, in which, merely by way of example, only one electrical contact 4 is disposed, as well as a component region 5, in which, merely by way of example, only one electrical component 7, connected via a conductive path 6 to the electrical contact 4, is disposed.

Furthermore, a housing 8 (covering element) is shown in FIG. 1. Even though only one electrical contact 4 is depicted, by way of example, in the contact region 3 in FIG. 1, numerous electrical contacts 4 can be provided in practice. This possibility is not illustrated in the depiction in FIG. 1 for spatial reasons. Although in FIG. 1, by way of example, only one electrical component 7 is depicted in the component region 5, in practice numerous electrical components 7 can also be provided. In order to save space, this possibility is also not implemented in the depiction FIG. 1. Likewise, only one conductive path 6 is shown, accordingly, merely by way of example, in FIG. 1, although in practice numerous conductive paths 6 can be provided, depending on the number of electrical contacts 4 and/or electrical components 7.

The printed circuit board 2 is partially covered by the cover element 8. In FIG. 1, continuous lines depict those sections of the printed circuit board 2 that are not covered by the cover element 8. The printed circuit board 2 can be a circuitry plate or suchlike, made of a suitable material. The contact region 3 of the printed circuit board 2 is not covered by the cover element 8. The contact region 3 of the printed circuit board is disposed outside the cover element 8. The contact region 4 of the printed circuit board 2 has a plurality of electrical contacts 4, even though in FIG. 1 only one such electrical contact 4 is depicted. The electrical contacts 4 in the contact region 3 of the printed circuit board 2 can be combined to form a shared contact assembly, or form a plurality of contact assemblies 3. The component region 5 of the printed circuit board 2 is covered by the cover element 8. The component region 5 of the printed circuit board 2 is disposed inside the housing, and can be formed on the top or bottom surfaces 13a, 13 of the printed circuit board 2. Even though it is not depicted in FIG. 1, the component region 5 can have numerous electrical components 7, which can be electronic components as well as switching elements, logic elements, or suchlike. The printed circuit board 2 has numerous conductive paths 6 between the contact region 3 and the component region 5, of which only one is shown in FIG. 1, by way of example, and which connect the electrical contacts 4 and the electrical components 7 to one another.

The housing 8, together with the printed circuit board 2 forms a closed interior space, in which the electrical components 7 are disposed. The interior space can be sealed such that it is fluid-tight with respect to an environment of the control device 1.

Figure 2:
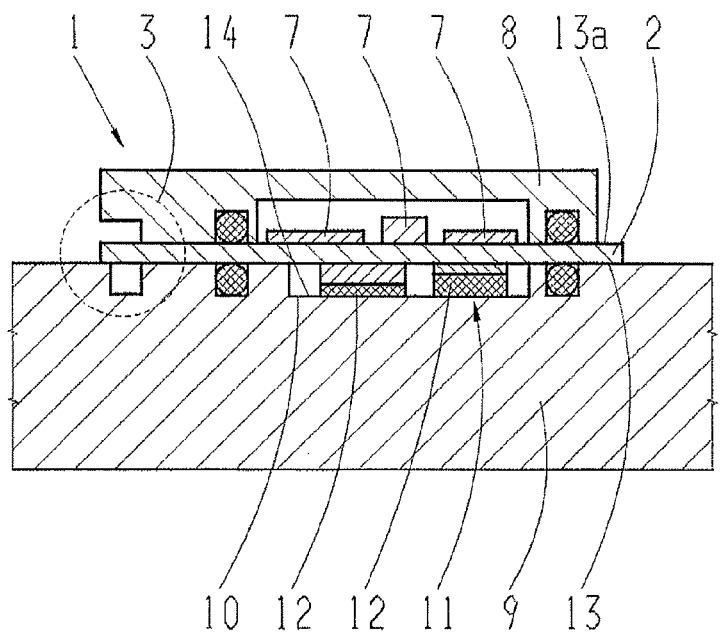
FIG. 2 is a schematic sectional depiction of a control device according to the prior art.

FIG. 2 shows a schematic sectional view of a control device 1 according to FIG. 1. A control device 1 is shown, having a printed circuit board 2, a contact region 4, electrical components 7 and a housing 8. The control device 1 is attached to a transmission element 9. The control device 1 is attached to a sub-region of a surface of the transmission element 9. The transmission element 9 can be a transmission housing or a hydraulic switch plate, or control, respectively, as is known to a person skilled in the art in the field of electronically controlled transmissions. The transmission element 9 has heat sink elements 12, or thermal compounds, respectively.

The transmission element 9 has an attachment region 11, in which the control device 1 is attached to the transmission element 9. The dimensions of the attachment region 11 can correspond thereby to the dimensions of the control device 1. The transmission element 9 has a component recess 10 in the attachment region 11. The component recess 10 is large enough to accommodate the electrical components 7 on the main surface 13 of the printed circuit board 2 facing the transmission element 9 in the component recess 10. Furthermore, thermal compounds 12 are disposed in the component recess 10 in the attachment region 11 of the transmission element 9. The heat sink elements 12 are disposed between a bottom surface 14 of the component recess 10 and the electrical components 7 on the main surface 13 of the printed circuit board 2 facing the transmission element 9. The heat sink elements 12 fill an intermediate space between the bottom surface 14 of the component recess 10 and the electrical components 7 on the main surface 13 of the printed circuit board 2 facing the transmission element 9.

FIG. 3 shows a schematic sectional view of a control device 1 according to one embodiment example of the present disclosure. A control device 1 having a housing 8 is shown, wherein the housing entirely encloses a printed circuit board 2. The printed circuit board 2 extends out of the housing 8 in the region of the connection contacts 4.

Figure 3A:
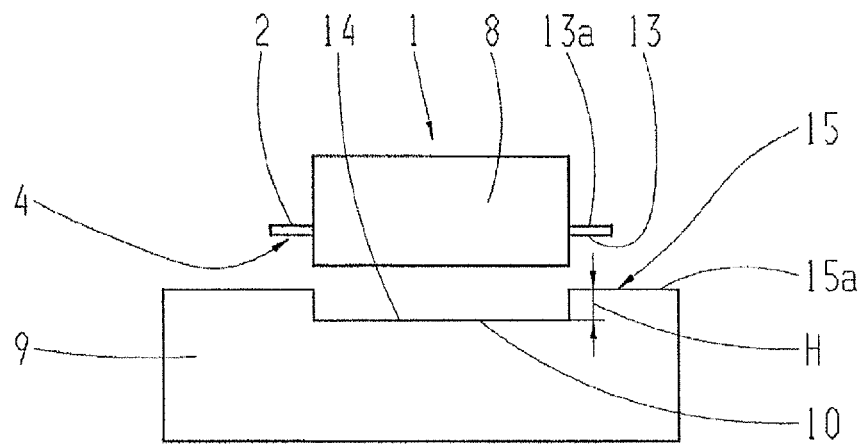
FIG. 3 is a schematic sectional depictions of a control device according to one embodiment example of the present disclosure.
Figure 3B:
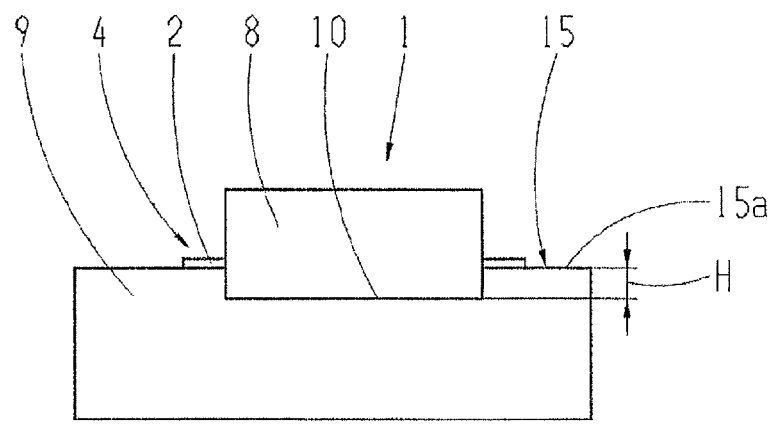

The transmission element 9 has a recess 10 (as shown in FIG. 3A), the surface area extension of which corresponds to at least the vertical projection of the housing 8 on the surface 15 of the transmission element 9. The height H of the recess 10 is selected such that the printed circuit board 2 is supported on the surface of the transmission element 9, i.e. the bottom 13 of the printed circuit board 2 and the top 15a of the transmission element 9 lie directly on one another (as shown in FIG. 3B).

The portion of the housing 8 inserted into the recess 10 lies directly on the base surface 14 of the transmission element 9. As a result, a good contact is ensured between the housing 8 and the transmission element 9, such that a good heat dissipation is possible.

The attachment means are not shown, by means of which the housing 8 for the control device 1 is connected to the transmission element 9. Various attachment possibilities are conceivable here. Aside from screw and clamp connections, a passive connection is also conceivable, to the extent that it is suitable for establishing a releasable connection between the control device and the transmission unit.

FIG. 4 shows another schematic sectional view of a control device 1 according to an embodiment example of the present disclosure. Corresponding to FIG. 3, a control device 1 having a housing 8 is shown, which entirely encloses a printed circuit board 2. The printed circuit board 2 extends out of the housing 8 in the region of the connection contacts 4.

Figure 4A:
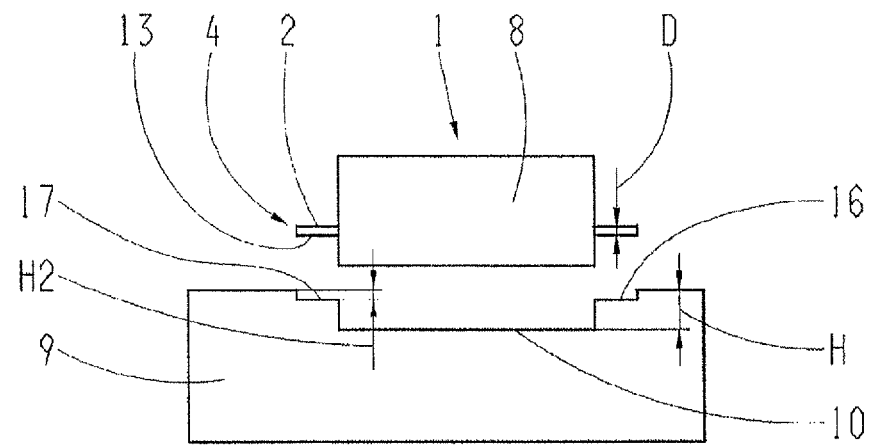
FIG. 4 is a schematic sectional depiction of a control device according to a further embodiment example of the present disclosure.
Figure 4B:
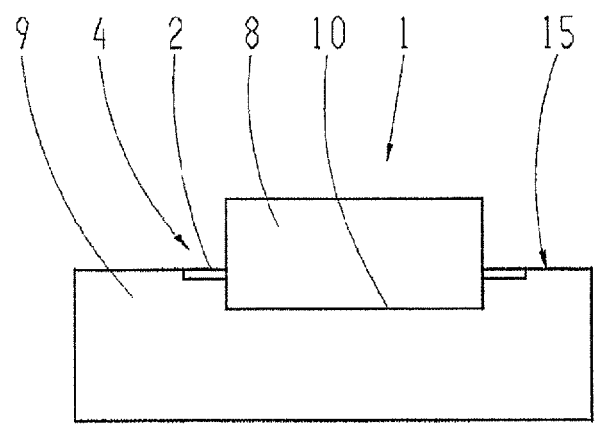

As has already been described in reference to FIG. 3, the transmission element 9 has a recess 10 (as shown in FIG. 4A), the surface area extension of which corresponds to at least the vertical projection of the housing 8 on the surface 15 of the transmission element 9. In addition, the transmission element 9 has another recess 16, having a surface area extension that corresponds to the vertical projection of the region of the printed circuit board 2 (e.g. the region for the connection contacts 4) located outside of the housing 8. The height H2 of the additional recess 16 corresponds, for practical purposes, to the thickness D of the printed circuit board 2. The height H of the recess 10 is selected such that the printed circuit board 2 is supported on the surface 17 of the transmission element 9, i.e. the bottom surface 13 of the printed circuit board 2 and the top surface 17 of the transmission element 9 in the region of the other recess 16 lie directly on top of one another (as shown in FIG. 4B).

REFERENCE SYMBOLS 1 control device
2 printed circuit board
3 connection region
4 connection contact
5 component region
6 conductive path
7 electrical component
8 housing
9 transmission element
10 component recess
11 attachment region
12 heat sink element
13 bottom surface of the printed circuit board
13a top surface of the printed circuit board
14 upper surface of the component recess 10
15 upper surface of the transmission element 9
15a upper surface of the transmission element 9
16 additional recess
H height of the component recess 10
H2 height of the additional recess 16
D thickness of the printed circuit board 2

The invention claimed is:

1. An electric control device attachment system comprising:
   a transmission element; and
   an electric control device connected to the transmission element, the electric control device comprising:
      a circuit board; and
      a housing that at least partially encompasses the circuit board,
   wherein the transmission element comprises a first recess configured to engage at least a portion of the housing, wherein the transmission element further comprises a second recess configured to accommodate regions of the circuit board extending outside of the housing.

2. The electric control device attachment system according to claim 1, wherein the electric control device is releasably connected to the transmission element.

3. The electric control device attachment system according to claim 1, wherein the circuit board includes a contact region.

4. The electric control device attachment system according to claim 3, wherein the contact region is located outside of the housing.

5. The electric control device attachment system according to claim 4, further comprising at least one opening in the housing designed to accommodate a plurality of conductive paths between the contact region and the portion of the circuit board encompassed by the housing.

6. The electric control device attachment system according to claim 3, wherein the contact region includes a plurality of electrical contacts.

7. The electric control device attachment system according to claim 1, wherein a space located within the housing is fluid-tight when the at least a portion of the housing is engaged with the first recess.

8. The electric control device attachment system according to claim 1, wherein a first dimension and a second dimension of the housing correspond to a first dimension and a second dimension of the first recess.

9. The electric control device attachment system according to claim 1, wherein the housing fits closely in the first recess.

10. The electric control device attachment system according to claim 1, wherein the depth of the first recess is sized such that a portion of the circuit board not encompassed by the housing contacts a top surface of the second recess when the at least a portion of the housing is engaged with the first recess.

11. The electric control device attachment system according to claim 1, wherein a portion of the housing directly contacts the transmission element when the at least a portion of the housing is engaged with the first recess.

12. The electric control device attachment system according to claim 11, wherein contact between the housing and the transmission element is conducive to dissipating heat from the electric control device to the transmission element.

13. The electric control device attachment system according to claim 1, further comprising at least one electronic component disposed on the circuit board.

14. The electric control device attachment system according to claim 1, wherein the transmission element is one of a hydraulic switch plate or a transmission housing.

15. The electric control device attachment system according to claim 1, wherein a first dimension and a second dimension of the regions of the circuit board extending outside of the housing correspond to a first dimension and a second dimension of the second recess.

16. The electric control device attachment system according to claim 1, wherein a depth of the second recess corresponds to a thickness of the circuit board.

17. The electric control device attachment system according to claim 1, wherein a depth of the second recess is sized such that a top surface of a portion of the circuit board not encompassed by the housing is level with a top surface of the transmission element when the at least a portion of the housing is engaged with the first recess.

18. An electric control device for attachment to a transmission element, the electric control device comprising: a circuit board; and a housing configured to encompass at least a portion of the circuit board, wherein the housing is configured to releasably engage a first recess in the transmission element, wherein a region of the circuit board extending outside of the housing is configured to engage a second recess distally opposite the first recess in the transmission element.

19. A housing for an electric control device, the housing comprising:
   an interior space configured to partially encompass a circuit board portion of the electric control device; and
   an exterior surface configured to releasably engage a first recess in a transmission element, wherein engagement between the exterior surface and the transmission element is conducive to dissipating heat from the circuit board to the transmission element, wherein a region of the circuit board extending outside the interior space is configured to engage a second recess distally opposite the first recess in the transmission element.

* * * * *